United States Patent
Li

(10) Patent No.: US 9,518,707 B2
(45) Date of Patent: Dec. 13, 2016

(54) STRIP LED

(71) Applicant: Rongbao Li, Shanghai (CN)

(72) Inventor: Rongbao Li, Shanghai (CN)

(73) Assignee: Rongbao Li, Shanghai (CN)

( * ) Notice: Subject to any disclaimer, the term of this patent is extended or adjusted under 35 U.S.C. 154(b) by 85 days.

(21) Appl. No.: 14/357,778

(22) PCT Filed: Nov. 20, 2012

(86) PCT No.: PCT/CN2012/084872
§ 371 (c)(1),
(2) Date: May 13, 2014

(87) PCT Pub. No.: WO2013/075609
PCT Pub. Date: May 30, 2013

(65) Prior Publication Data
US 2014/0313725 A1 Oct. 23, 2014

(30) Foreign Application Priority Data
Nov. 21, 2011 (CN) .......................... 2011 1 0370522

(51) Int. Cl.
*H01L 33/58* (2010.01)
*F21K 99/00* (2016.01)
*F21S 4/00* (2016.01)
*H01L 25/075* (2006.01)
*H01L 33/54* (2010.01)
*F21Y 101/00* (2016.01)

(52) U.S. Cl.
CPC . *F21K 9/30* (2013.01); *F21K 9/20* (2016.08); *F21S 4/008* (2013.01); *F21S 4/20* (2016.01); *F21S 4/22* (2016.01); *F21Y 2101/00* (2013.01); *H01L 25/0753* (2013.01); *H01L 33/54* (2013.01); *H01L 2924/0002* (2013.01)

(58) Field of Classification Search
CPC .............. F21S 4/005; F21S 4/008; F21K 9/30; H01L 25/02753; H01L 33/54
USPC ...................................... 362/249.02
See application file for complete search history.

(56) References Cited

U.S. PATENT DOCUMENTS

| | | | | |
|---|---|---|---|---|
| 8,376,564 B2* | 2/2013 | Finn | ........................ | A41B 9/04 |
| | | | | 2/905 |
| 8,511,849 B2* | 8/2013 | Sloan | .................... | F21V 33/006 |
| | | | | 362/217.02 |
| 8,651,711 B2* | 2/2014 | Rudisill | ................ | F21V 29/004 |
| | | | | 362/249.02 |
| 8,764,220 B2* | 7/2014 | Chan | ...................... | F21S 4/008 |
| | | | | 362/217.02 |
| 8,789,988 B2* | 7/2014 | Goldwater | ............. | F21S 4/005 |
| | | | | 362/217.01 |
| 2009/0279298 A1* | 11/2009 | Mier-Langner | ....... | F21V 21/096 |
| | | | | 362/235 |

(Continued)

*Primary Examiner* — Anabel Ton
(74) *Attorney, Agent, or Firm* — CBM Patent Consulting, LLC

(57) ABSTRACT

A strip LED comprises an LED chip, an embedded resistor, a magnet, a magnetic material, a strip encapsulation bracket and a power source. An installation bracket for the embedded resistor and the LED chip is provided between connection brackets. The connection bracket metal strips a and b and metal strips c and d are either a single narrow and thin metal strip or a plurality of thin metal wire structures. The magnet is fixed at one end of a wire, and another end of the wire is connected to the power source.

8 Claims, 2 Drawing Sheets

(56) References Cited

U.S. PATENT DOCUMENTS

| | | | | |
|---|---|---|---|---|
| 2010/0008090 A1* | 1/2010 | Li | ............... | F21V 17/007 |
| | | | | 362/249.03 |
| 2010/0097780 A1* | 4/2010 | Beatenbough | ......... | A47F 3/001 |
| | | | | 362/92 |
| 2011/0149570 A1* | 6/2011 | Wenzlick | ............ | F21L 14/023 |
| | | | | 362/249.02 |
| 2011/0271834 A1* | 11/2011 | Lehman | ............ | B01D 47/021 |
| | | | | 95/213 |

* cited by examiner

STRIP LED

This application is the U.S. national phase of International Application No. PCT/CN2012/084872 filed on 20 Nov. 2012 which designated the U.S. and claims priority to Chinese Application Nos. CN201110370522.7 filed on 21 Nov. 2011, the entire contents of each of which are hereby incorporated by reference.

TECHNICAL FIELD

The present invention relates to the technical field of LED encapsulation and application, and particularly, to a strip LED.

BACKGROUND ART

The strip LED is small and fine, with a minimum width of 2 mm, a thickness of 1-2 mm and a minimum lighting interval of 3 mm. The flexibility is so good that it can be bent randomly in a 3D space; it can be cut off randomly for any length required in actual use; and it can be connected randomly, without any influence to the effects in use; and it is very convenient to be stuck anywhere necessary like a sticky note.

A Chinese patent CN201688230U disclosed an LED lamp band, comprising a main lead flexible circuit board, a LED bearing circuit board and LED lamps, wherein the LED bearing circuit board is a flexible circuit board integrated with edge of the main lead flexible circuit board; a rotational bending with edge of the main lead flexible circuit board as pivot can be realized by using flexibility of the circuit board, the effect of this rotational bending is shown on lighting direction change of the LED lamp; the rotational bending of the main lead flexible circuit board on plane can be realized by using flexibility of the main lead flexible circuit board, the effect of this rotational bending is shown on shape change of the LED lamp band, but it is difficult to rotationally bend the LED lamp band and easy to be influenced by the rotation angle of LED lamp; especially when the LED lamp is rotated to an angle of 0°-90°, shape change of the LED lamp band is greatly limited while guaranteeing the front lighting. Moreover, it adopts circuit board to carry LED and electronic devices, so it cannot be bent at any angle or cut randomly.

SUMMARY OF THE INVENTION

The present invention aims to improve the existing technology and encapsulation structure and provide a more practical, more useful and more reliable strip LED structure and encapsulation method. This strip LED structure can be bent randomly in a 3D space and cut at any length, and it is very convenient to install and wire; it can be deployed at a small special installation position, and it can be bent to form words and patterns; besides, it can be also applied outdoors.

In order to achieve the above purpose, the present invention designs a strip LED, including an LED chip, an embedded resistor, a magnet, a magnetic material, a strip encapsulation bracket and a power source, wherein the strip LED is of an elongated strip shape, and an installation bracket for the embedded resistor and the LED chip is provided between connection bracket metal strips b and c; an upper metal strip a is connected with the metal strip b, and the lower metal strip c is connected with a metal strip d, while the connection bracket metal strips a and b and metal strips c and d are either a single narrow and thin metal strip or a plurality of thin metal wire structures; all of or a part of the connection brackets are made of a magnetic metal material, and the metal strips b and c are bent inwards for 90 degrees; impression lines e and f are provided separately at left and right of the installation bracket for the embedded resistor and the LED chip, and rectangular metal blocks g and h are provided outside of the impression lines e and f separately; the rectangular metal blocks g and h are bent inwards for 90 degrees along the impression lines to form an LED encapsulation bowl; the embedded resistor is provided on a bracket in the encapsulation bowl and connected with the LED chip with metal wire in series; epoxy resin is encapsulated on the bowl, and the rectangular metal blocks g and h are separated after curing of the epoxy resin, such that the long brackets at two sides of the strip LED, namely the metal strips a and b and the metal strips c and d are in non-conducting state; the magnet is fixed at one end of a wire, and another end of the wire is connected to the power source, such that the magnet on the bracket is used to lead the power source wiring by adsorption in actual use.

The strip LED similar to rectangle is replaced by a shape of square, circle, H-shape, L-shape, T-shape, Y-shape or oval and other geometrical shapes.

The strip LED is 2 mm, the minimum lighting interval is 3 mm, current of a single LED is 20 mA-1 A, and the voltage is 3-24 volts.

The embedded resistor is provided in the strip LED encapsulation.

The bracket, the LED chip and the embedded resistor are connected in series, while all LEDs are is parallel connection with the LED lamps formed by series connection of the embedded resistors.

There is one or more than one embedded resistor, and there is one or more than one LED chip.

Transparent adhesive sticker is provided on the front, back or two sides of the strip LED. The present invention further comprises a production method of the strip LED as follows:

a) Designing structure and shape of the strip bracket, arranging the impression lines, setting structure and shape of the installation bracket for the embedded resistor and the LED chip, all of or a part of the connection brackets at two sides of the strip bracket being made of a magnetic metal material;

b) Bending the metal strips b and c for 90 degrees;

c) Bending the rectangular metal blocks at two sides of the installation bracket for the embedded resistor and the LED chip for 90 degrees along the impression line, so as to form a structure of LED encapsulation bowl;

d) Connecting one terminal of the embedded resistor to one side of the bracket in the bowl, and connecting the other terminal to the LED chip in series with metal wire, and connecting the other terminal of the chip with the other side of the bracket, with epoxy resin encapsulated in the bowl;

e) Separating the rectangular metal blocks g and h after curing of the epoxy resin, such that the long brackets at two sides of the strip LED, namely the metal strips a and b and the metal strips c and d are in non-conducting state;

f) On the strip LED connection bracket metal strips a and b and metal strips c and d, the power source wiring can be led out from a plurality of points; the power source access is convenient and reliable, which resolves voltage drop problem caused by small section area of connection bracket, low-voltage direct current and limitation that current cannot be too strong; at the same time, the phenomena of a large segment not lighting due to a broken line or the damage of any devices can be avoided.

g) After encapsulation is accomplished or the magnetic connection bracket metal strips a and b and metal strips c and d are connected with the LED lamps formed by the embedded resistor and the LED chip through welding, mechanical bayonet connection, or conducting resin gluing, coating the strip LED with transparent rubber and plastics;

h) Arranging transparent adhesive sticker on the sides required.

The present invention is an innovative environment-friendly product. It can be used as a new advertisement lighting material, and improvement or replacement of LED lamp band, LED module, neon lamp, and sticky note and so on. It is simple and convenient to use, time-saving and labor-saving, good in advertisement effect, and wide in application range. It can be stuck on glass of doors and windows or spray painting, for use as luminous words, patterns and logos on the luminous shop front, door plate or stage background; it can also be used as luminous indicators in public areas like hotels and shopping malls; besides, it can be used as back lighting of special lamp boxes (for example, the real thin lamp box with a thickness of 2-3 cm, and rollable lamp box and so on); and it can also be used for crystal chandelier, various of art lamps and indoor decorative lighting; it can be used on special luminous words (for example, thin luminous words, patterns, logo or small luminous words and so on); further, it can be used for lighting for special or very small installation position, and illumination of various of special requirements. The product possesses good sealing performance, so it can be used indoors or outdoors; it can be bent to form different words, patterns or logos for decoration and advertisement, and it can also be used as light source for lamp box, luminous words, lamps and various kinds of illuminators.

In the figures: a, b, c and d are the metal strips; e and f are the impression lines; g and h are the rectangular metal blocks; i is the magnet; and j is the wire.

DETAILED DESCRIPTION OF THE PREFERRED EMBODIMENTS

The following is detailed description of the utility model in combination with the drawings. The production technology of the device is very clear to the persons skilled in the art.

Figure 1:
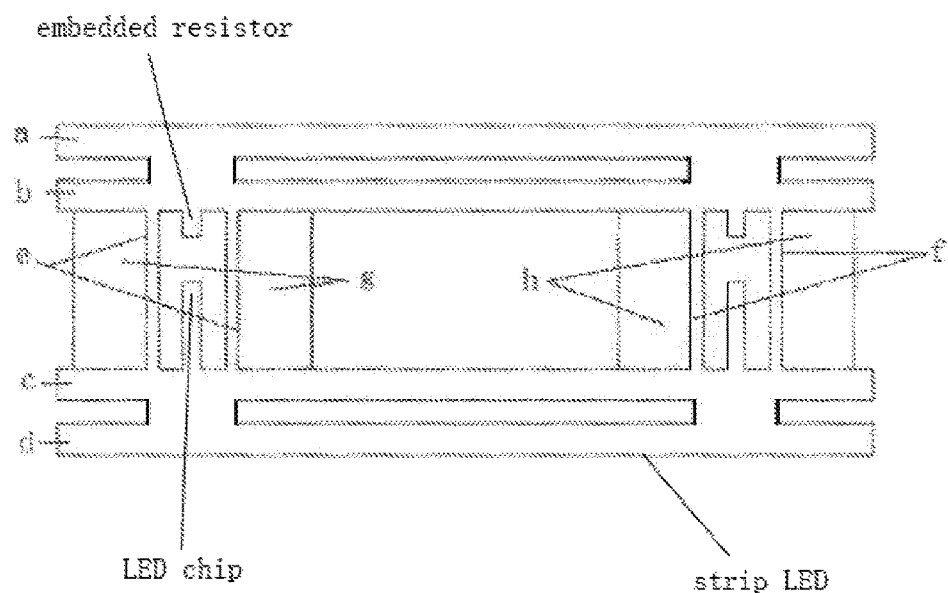
FIG. 1 is the expanded view of the bracket of the present invention.

The strip LED adopts a new encapsulation form, namely connecting the brackets to form unidirectional continuous strip encapsulation. Therefore, shape of the LED produced is also a new form, namely the continuous strip shape (currently, there are only two types of encapsulation, single LED and assembled LEDs). In order to realize this encapsulation, it is prerequisite to adopt new bracket structure and encapsulation technology:

1. Expansion of the frame structure (as shown in FIG. 1): the strip LED is of an elongated strip shape, an installation bracket for the embedded resistor and the LED chip is provided between connection bracket metal strips a and b and metal strips c and d; an upper metal strip a is connected with the metal strip b, and the lower metal strip c is connected with a metal strip d, while the connection bracket metal strips a and b and metal strips c and d are either a single narrow and thin metal strip or a plurality of thin metal wire structures; all of or a part of the connection brackets are made of a magnetic material; impression lines e and f are provided separately at left and right of the installation bracket for the embedded resistor and the LED chip, and rectangular metal blocks g and h are provided outside of the impression lines e and f separately; resistance of the embedded resistor, type and size of the LED chip, and shape and structure of the installation bracket are determined separately according to different requirements, FIG. 1 is only for schematic use.

Figure 2:
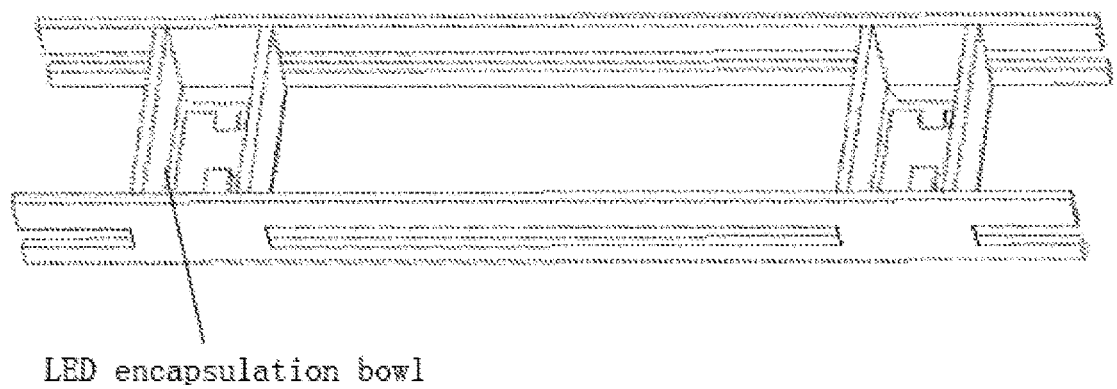
FIG. 2 is the schematic diagram of an LED encapsulation bowl of the present invention.

2. As shown in FIG. 2, the metal strips b and c are bent inwards for 90 degrees, and the rectangular metal blocks g and h at two sides of the installation bracket for the embedded resistor and the LED chip are bent inwards for 90 degrees along the impression lines to form an LED encapsulation "bowl".

Figure 3:
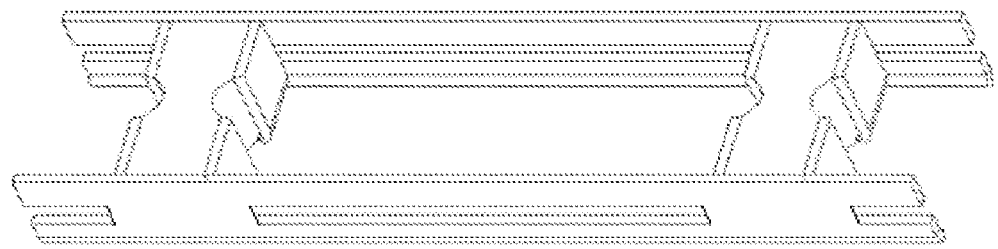
FIG. 3 is the schematic diagram of the separated rectangular metal blocks g and h at two sides after curing of the epoxy resign in the present invention.
Figure 4:
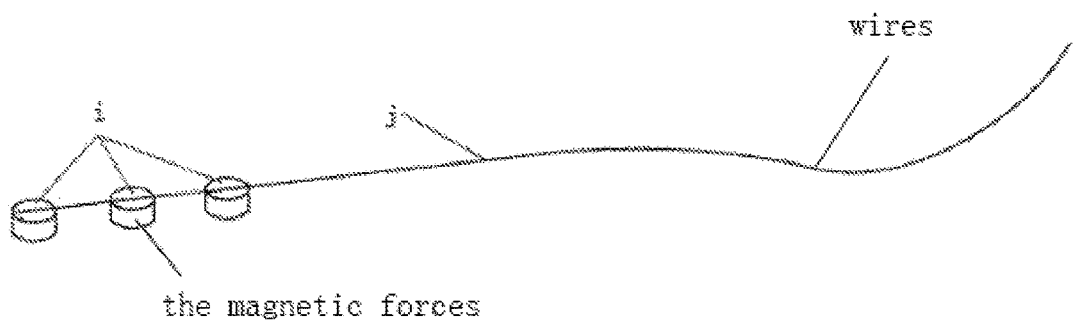
FIG. 4 is the schematic diagram of the magnet connected at one end of the wire of the present invention.
Figure 5:
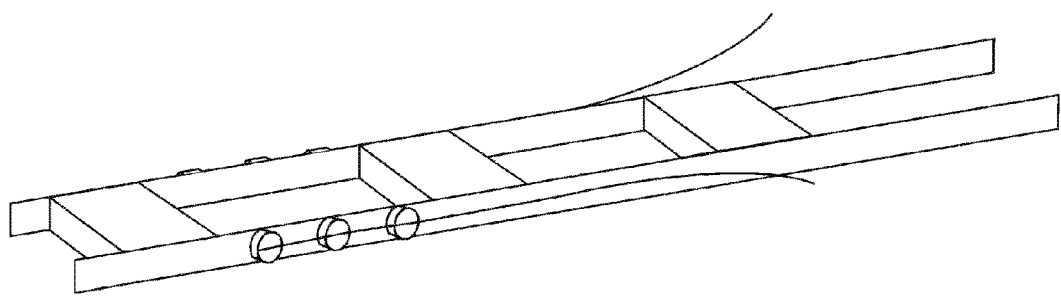
FIG. 5 is the schematic diagram of the magnet, with a wire welded thereon in actual use, on the connection bracket with the embedded resistor and LED chip.

3. As shown in FIG. 3, a bracket is provided in the in the encapsulation "bowl" with the embedded resistor (the resistance is determined according to various types of LED) connected thereon, and the embedded resistor is connected with the LED chip with metal wire in series; the chip is connected with another bracket and epoxy resin is encapsulated in the bowl, and a small piece of cured epoxy resin is removed, such that the long brackets at two sides of the strip LED are in non-conducting state.

4. After encapsulation is accomplished or the magnetic connection brackets are connected with the LED lamps formed by the embedded resistor and the LED chip through welding, mechanical bayonet connection, or conducting resin gluing, the strip LED is coated with transparent rubber and plastic pipe.

5. The transparent adhesive sticker is provided on the sides required (some may be stuck on glass, which requires sticking on the front, so it can give out light through the glass; some are stuck directly on the place required, then the adhesive sticker needs to be provided on the back, so it can be stuck on the back and gives out light on the front); together with the encapsulated LED, the transparent adhesive sticker is sealed by silica gel or coated by rubber and plastic pipe in a mould.

6. In actual use, the magnet, with a wire welded thereon, is absorbed on the connection bracket to lead the power source wiring from a plurality of points, which is very convenient for the power source access, which directly resolves voltage drop problem caused by small section area of connection bracket, low-voltage direct current and limitation that current cannot be too strong; at the same time, the phenomena of a large segment not lighting due to a broken line or the damage of any devices can be avoided.

As a result, a new encapsulation type (unidirectional continuous strip encapsulation) is formed; and the new LED shapes produced (continuously strip-shaped, randomly bendable, small and fine, randomly cuttable, magnet-absorbed wiring, convenient and reliable) are applied to many new fields, and can also be used to make more new products.

Embodiment 1

If it is used for luminous indicators and marks on transparent glass or acrylic in public places like hotels and shopping malls, the words or patterns of the indicator and marks are luminous while other parts are transparent. It is very compelling and beautiful as if there are only words or patterns of the indicator and marks shining in the air. Or it can be used as warning notes stuck on the glass door or glass window of hotels, shopping malls, salesrooms or shops. The warning notes are generally sticky notes now, if the present product is used to replace the sticky notes, it is more beautiful and the warning effect is better; if the present product is made into logos or other advertisement words and patterns, it can bring better advertisement effect with strong visual impact.

For this use, the products need to be visible from a far distance, so the lines need to be thin and the power is unnecessary to be big but the it should be bright, with a normal the lighting interval; therefore, the colorful LED with a width of 3 mm, a lighting interval of 6 mm, a current of 20 mA and a power of 0.06 w is adopted.

The frame structure is as shown in FIG. 2, the common voltage of 5v is adopted, so resistance of the embedded resistor is 150 ohms. The embedded resistor is connected with the LED chip in series, after epoxy resin encapsulation is accomplished, the two sides are cut; then a transparent rubber and plastic pipe is used to coat the product, and an adhesive sticker is stuck on the front (to be stuck on glass, so the light can be emitted through the glass).

LED needs a current of only 20 mA, and the length is generally not too long; therefore, it is only necessary to absorb one magnet, with a wire fixed thereon, onto the two ends separately with the positive poles towards the same direction, with the wire connected to a 5v direct current power source.

If the adhesive sticker is stuck on the back of the product, it can be used for spray painting; for example, it can be stuck on the painting cloth for conferences and exhibition to form luminous words or patterns. It can be stuck on the original signboard made by spray painting or sticky note to form signboard with luminous words, which is not only beautiful, but also much cheaper than the acrylic luminous words, and more energy-saving and environment-friendly.

Embodiment 2

On the basis of the above embodiment, color of the LED is changed to white (or other colors and types), and the interval is reduced to 3-4 mm, then it can be used for crystal chandelier: sticking it to the crystal parts of the crystal chandelier (for example, sticking it to a small circle on the crystal balls), the wire adopts enameled wire and is coated with the same color as the metallic hanger (for example, golden and silver). The light of crystal chandelier made in this way is emitted through crystal, each crystal pendant is glittering and translucent, fascinating and very beautiful; besides, it is long in service life, power-saving and environment-friendly; it avoids problems of checking and changing the lamps frequently; and according to actual requirements of users, it can also be used to make crystal chandeliers emitting light of different colors, and even multi-color light.

There are many other similar applications. For example, by sticking the strip LED onto a delicate and beautiful handicraft skillfully, the handicraft becomes a more perfect handicraft, as well as a lamp, being beautiful and practical. And there are too many other similar applications to mention here.

What is claimed is:

1. A strip LED comprises an LED chip, an embedded resistor, a magnet, a strip encapsulation bracket and a power source;
wherein the strip LED is of an elongated strip shape, and an installation bracket for the embedded resistor and the LED chip is provided between a connection bracket metal strip b and a connection bracket metal strip c; an upper metal strip a is connected with a metal strip b, and a lower metal strip c is connected with a metal strip d, and the metal strip b and the metal strip c are bent inwards for 90 degrees;
an impression line e and an impression line f are respectively provided at the left and right of the installation bracket for the embedded resistor and the LED chip, and a rectangular metal block g and a rectangular metal block h are provided outside of the impression lines e and f, respectively; the rectangular metal blocks g and h are bent inwards for 90 degrees along the impression lines to form a structure named as an LED encapsulation bowl that is encapsulated with epoxy resin; the embedded resistor is provided on said strip encapsulation bracket in the encapsulation bowl and connected with the LED chip with metal wire in series;
the rectangular metal block g and the rectangular metal block h are separated after curing of the epoxy resin;
the magnet is fixed on one end of wire while the other end of wire connects the power source, the wires for conducting electricity are fixed on the brackets by magnetic forces.

2. The strip LED according to claim 1, wherein the connection bracket metal strips are connected with the the embedded resistor and the LED chip through welding, mechanical bayonet connection, or conducting resin gluing.

3. The strip LED according to claim 1, wherein the rectangle shape of the strip LED is replaced by a shape selected from a group consisting of square, circle, H-shape, L-shape, T-shape, Y-shape oval and other geometrical shapes.

4. The strip LED according to claim 1, wherein minimum width of the strip LED is 2 mm, the minimum lighting interval is 3 mm, current of a single LED is 20 mA and 1 A, and the voltage is 3and 24 volts.

5. The strip LED according to claim 2, wherein the bracket, the LED chip and the embedded resistor are connected in series, while the strip LEDs are parallel connected by series connection of the embedded resistors.

6. The strip LED according to claim 1, wherein the magnetic connection bracket metal strips a and b and metal strips c and d are connected with the LED lamps formed by the embedded resistor and the LED chip by welding, mechanical bayonet connection, or conducting resin gluing, the strip LED is coated with transparent rubber or/and plastics.

7. The strip LED according to claim 1, wherein there is one or more than one embedded resistor, and there is one or more than one LED chip.

8. The strip LED according to claim 1, wherein all of or a part of the connection bracket is made of magnetic metal material.

* * * * *